United States Patent [19]

Miyajima et al.

[11] Patent Number: 5,113,166
[45] Date of Patent: May 12, 1992

[54] MAGNETIC FIELD GRADIENT COIL SYSTEM

[75] Inventors: Goh Miyajima, Katsuta; Takao Takahashi, Hitachi; Tuyosi Shudo, Katsuta; Shohei Suzuki, Takahagi, all of Japan

[73] Assignee: Hitachi, Ltd., Tokyo, Japan

[21] Appl. No.: 447,863

[22] Filed: Dec. 8, 1989

[30] Foreign Application Priority Data

Dec. 14, 1988 [JP] Japan .................. 63-313874

[51] Int. Cl.$^5$ .................................... H01F 5/00
[52] U.S. Cl. .................... 335/299; 324/319
[58] Field of Search ............... 335/209–214, 335/216, 296–301; 324/318, 319, 320; 128/653 R, 653 SC; 505/892, 893

[56] References Cited

U.S. PATENT DOCUMENTS

| | | | |
|---|---|---|---|
| 4,468,622 | 8/1984 | Frese et al. | 324/319 |
| 4,584,548 | 4/1986 | Inoue et al. | 335/299 |
| 4,724,412 | 2/1988 | Kalafala | 335/299 |
| 4,857,848 | 8/1989 | Takechi et al. | 324/318 |
| 4,890,082 | 12/1989 | Fujita | 335/301 |

FOREIGN PATENT DOCUMENTS 5853742  8/1981  Japan .

OTHER PUBLICATIONS

Turner, R. et al., Passive Screening of Switched Magnetic Field Gradients, 1981, 876–879.

*Primary Examiner*—Leo P. Picard
*Assistant Examiner*—Ramon Barrera
*Attorney, Agent, or Firm*—Antonelli, Terry, Stout & Kraus

[57] ABSTRACT

A magnetic field gradient coil system for use in a magnetic resonance imaging apparatus forming a magnetic field gradient in a direction of a Z-axis of an X, Y, Z orthogonal coordinate system having its origin at a selected position in the imaging apparatus comprises one pair of first coils and one pair of second coils having their centers on the Z-axis and having the same radius, the coils of each coil pair disposed symmetrically with respect to an XY plane including the origin, the coils of the second coil pair disposed more distant from the origin than the coils of the first coil pair, the coils of the first and second coil pairs disposed on one side of the origin supplied with current in the same direction, the coils disposed on the other side of the origin supplied with current opposite to the direction of current in the coils on the one side of the origin, each of the coils of the first coil pair disposed where the value of the Z-axis magnetic field component of first order at a selected position on the Z-axis becomes substantially maximum, and the ampere-turn and position of each of the coils of the second coil pair selected so that, at the selected position, the Z-axis magnetic field components of third and fifth orders provided by the second coil pair have values which can substantially cancel the Z-axis magnetic field components of third and fifth orders provided by the first coil pair.

5 Claims, 4 Drawing Sheets

MAGNETIC FIELD GRADIENT COIL SYSTEM

BACKGROUND OF THE INVENTION

1. Field of the Invention

This invention relates to a magnetic resonance imaging apparatus, and more particularly to a magnetic field gradient coil system suitable for use in a magnetic resonance imaging apparatus of superconducting type.

2. Description of Related Art

In a magnetic resonance imaging apparatus, a pulse current is supplied to its magnetic field gradient coil unit. Thus, when an electrical conductor is present in a range which is influenced by the magnetic field produced by the magnetic field gradient coil unit, an eddy current is induced in the electrical conductor at the rise time and fall time of each of the pulses of the pulse current. The flow of this eddy current leads to a decreased field strength of the effective magnetic field gradients produced by the magnetic field gradient coil unit and leads also to a degraded linearity of the magnetic field gradients.

In a magnetic resonance imaging apparatus of superconducting type using a superconducting coil unit kept at a very low temperature, a heat reflecting cylindrical member is provided so as to enhance the effect of thermally shielding the superconducting coil unit against the ambient atmosphere, and this heat reflecting cylindrical member is located to surround a magnetic field gradient coil unit. Leakage of the magnetic field produced by the magnetic field gradient coil unit toward the superconducting coil unit should be avoided, and, for that purpose, the heat reflecting cylindrical member is made of an electrical conductor such as aluminum or copper, so that flow of an eddy current in the heat reflecting cylindrical member can produce an inverse magnetic field which cancels the leakage magnetic field.

The superconducting coil unit is disposed inside a coolant tank filled with a coolant such as liquid helium, and this coolant tank is commonly made of a stainless steel having a high electrical resistance. Therefore, when the magnetic field produced by the magnetic field gradient coil unit leaks toward and into the coolant tank, an eddy current is induced in the stainless steel forming the coolant tank, and the temperature of the coolant tank rises up to a high level so as to accelerate vaporization of the coolant. This is the greatest reason why leakage of the magnetic field produced by the magnetic field gradient coil unit toward the superconducting coil unit should be prevented.

However, as described already, the flow of the eddy current in the heat reflecting cylindrical member leads to a decrease in the primarily required strength of the effective magnetic field gradients produced by the magnetic field gradient coil unit and leads also to a degraded linearity of the magnetic field gradients. It is now strongly demanded to reduce the size of the superconducting magnet. However, when the size of the superconducting magnet is to be made smaller, the heat reflecting cylindrical member must inevitably be located closer to the magnetic field gradient coil unit. Thus, when the heat reflecting cylindrical member is located at such a position, the adverse effect of the eddy current will be further intensified, and the desired reduction of the size of the superconducting magnet will become impossible as a matter of fact.

Journal of Physics E: Scientific Instrument, 1981, Vol. 14 discloses, at pages 876–879, a magnetic field gradient coil system for forming a magnetic field gradient in a direction of a Z-axis of an X, Y, Z orthogonal coordinate system having its origin at about the center of a sensor probe, the magnetic field gradient coil system comprising one pair of inner coils located in a relation symmetrical with respect to an XY plane having its center on the Z-axis and including the origin, and one pair of outer coils located also in a relation symmetrical with respect to the XY plane, the inner coils having the same radius a and being disposed at a distance $d_1$ from the origin, while the outer coils having the same radius as that of the inner coils and being disposed at a distance $d_2$ from the origin. In the disclosed magnetic field gradient coil system, the values of the distances $d_1$ and $d_2$ are selected to be $|d_1|=0.49a$ and $|d_2|=1.28a$ when the ratio b/a between the mean radius b of a cylindrical electrical conductor forming a heat reflecting cylindrical member and the radius a of the inner and outer coils is selected to be $b/a=9/7$.

According to the disclosed magnetic field gradient coil system, the axial magnetic field component of fifth order shows a great decrease. However, because the axial magnetic field component of third order is not cancelled by the inner and outer coils, the effective magnetic field gradient in the direction of the Z-axis has a degraded linearity, and the field strength of the effective magnetic field gradient shows also a great decrease. It has been clarified that the degraded linearity and decreased field strength are attributable to the following facts:

(1) Although the value of the axial magnetic field component of fifth order is nearly zero in the case of the inner coils, the axial magnetic field component of first order does not show its maximum value.

(2) Although the value of the axial magnetic field component of fifth order is nearly zero in the case of the outer coils, the axial magnetic field component of first order shows a very small value.

JP-A-58-53742 discloses a magnetic field gradient coil system which comprises one pair of inner coils and one pair of outer coils similar to those described above and which improves the linearity of the magnetic field gradient. However, in the latter magnetic field gradient coil system which is associated by a heat reflecting cylindrical member made of an electrical conductor, the adverse effect of an eddy current induced in the electrical conductive cylindrical member is not taken into consideration at all.

SUMMARY OF THE INVENTION

It is an object of the present invention to provide a magnetic field gradient coil system which can provide an effective magnetic field gradient having a sufficient strength and in which the magnetic field gradient shows an excellent linearity.

An embodiment of the magnetic field gradient coil system according to the present invention comprises, for the purpose of forming a magnetic field gradient in a direction of a Z-axis of an X, Y, Z orthogonal coordinate system having its origin at about the center of a sensor probe, one pair of first coils and one pair of second coils having their centers on the Z-axis and having the same radius, the coils of each coil pair being disposed symmetrically with respect to an XY plane including the origin, the coils of the second coil pair being located more distant from the origin than the coils of the first coil pair, the coils of the first and second coil pairs disposed on one side of the origin being supplied with current flowing in the same direction, while the coils disposed on the other side of the origin being supplied with current flowing in a direction opposite to the direction of current flow in the coils disposed on the one side of the origin, each of the coils of the first coil pair being disposed at such a position where the value of the Z-axis magnetic field component of first order at a selected position on the Z-axis becomes substantially maximum, and the ampere-turn and position of each of the coils of the second coil pair being selected so that, at the selected position, the Z-axis magnetic field components of third and fifth orders provided by the second coil pair have values which can substantially cancel the Z-axis magnetic field components of third and fifth orders provided by the first coil pair.

DESCRIPTION OF THE PREFERRED EMBODIMENTS

Figure 1:
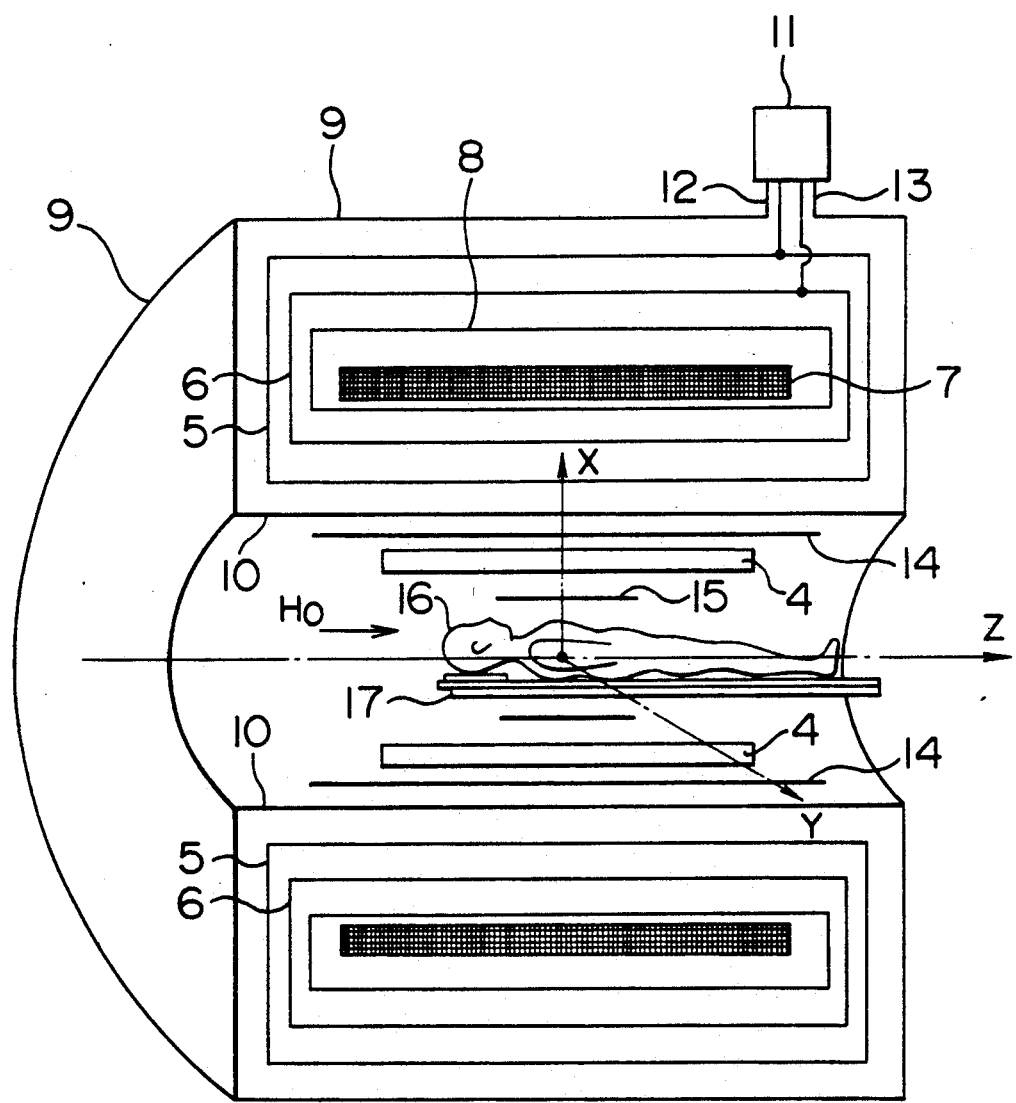
FIG. 1 is a sectional, schematic perspective view of a magnetic resonance imaging apparatus to which an embodiment of the magnetic field gradient coil system according to the present invention is applied.

FIG. 1 is a sectional, schematic perspective view of a magnetic resonance imaging apparatus to which an embodiment of the magnetic field gradient coil system according to the present invention is applied. It is supposed that an X, Y, Z orthogonal coordinate system has its origin O at about the center of a sensor probe 15. A superconducting coil unit 7 is cylindrically wound around the Z-axis, which is the central axis, so as to produce an electrostatic magnetic field $H_0$ in the direction of the Z-axis. This superconducting coil unit 7 is disposed in a cylindrical coolant tank 8 which is coaxial with the superconducting coil unit 7 and filled with liquid helium. Heat reflecting cylindrical members 5 and 6 made of an electrical conductor such as aluminum or copper are provided to enclose the coolant tank 8 in the double-walled structure. The heat reflecting cylindrical members 5 and 6 are further enclosed in a high-vacuum cylindrical chamber defined in an outer cylindrical member 9. A cylindrical space extending in the direction of the Z-axis is formed along the central axis of the outer cylindrical member 9, and a magnetic field corrector 14 as described in detail hereinafter, a magnetic field gradient coil unit 4 according to the present invention, and a sensor probe 15 are disposed in that order in the cylindrical space formed around the Z-axis.

A table 17 carrying an object 16 to be examined can be externally conveyed into and out of the portion of the cylindrical space surrounded by the sensor probe 15. A refrigerator 11 absorbs heat from the heat reflecting cylindrical members 5 and 6 through thermal conductors 12 and 13 so as to maintain the temperatures of the heat reflecting cylindrical members 5 and 6 at 20° K. and 80° K. respectively.

A high-frequency magnetic field is applied to the object 16 for the purpose of MR imaging, and the sensor probe 15 detects an MR signal generated from the object 16. The magnetic field corrector 14 is provided with a current shim coil or a passive shim so as to correct non-uniformity of the electrostatic magnetic field.

Figure 2:
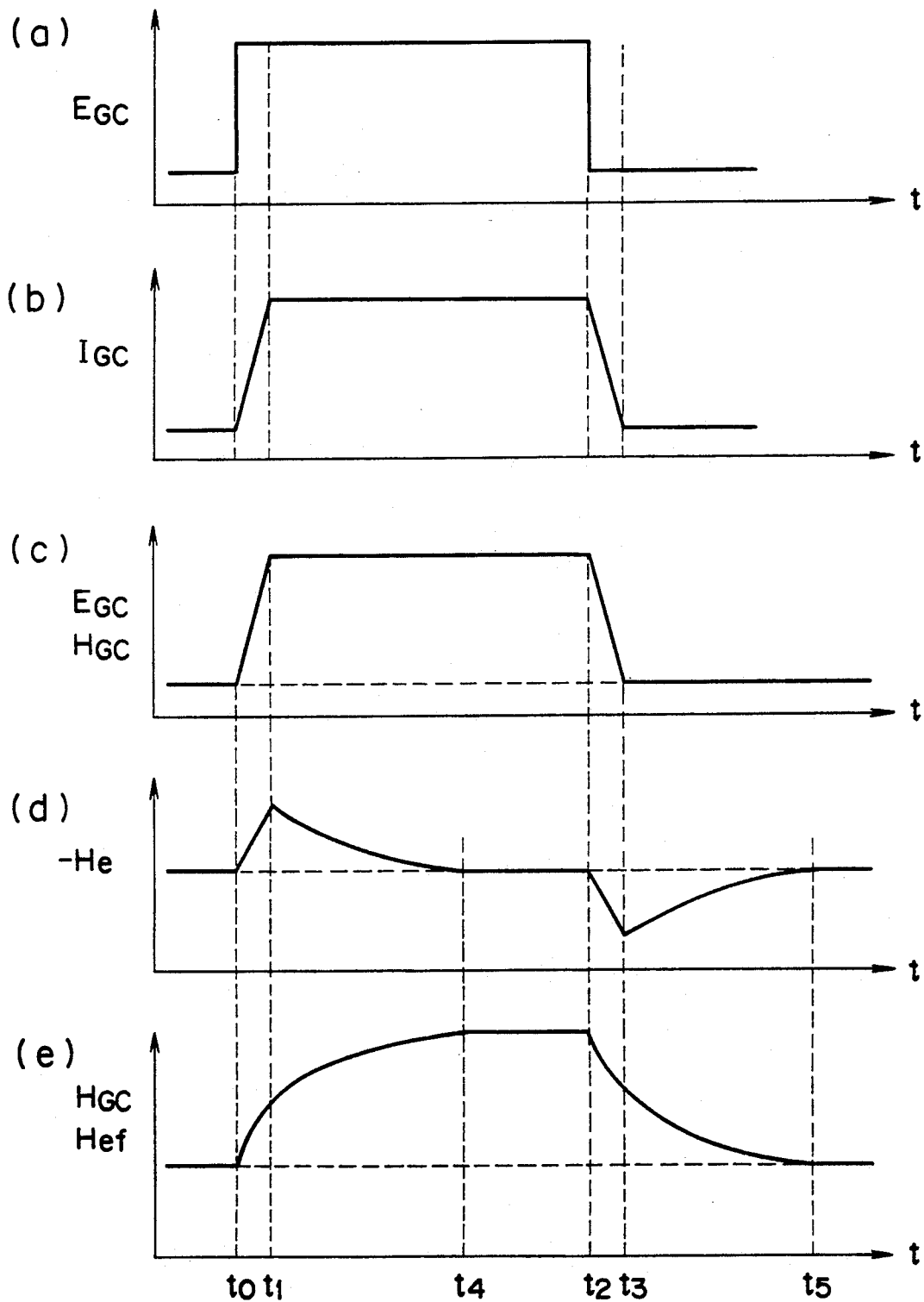
FIG. 2 is a graph illustrating how a magnetic field gradient produced in the direction of the Z-axis by magnetic field gradient coils in a coil unit as shown in FIG. 1 is adversely affected by an eddy current induced in a magnetic resonance imaging apparatus as shown in FIG. 1.

FIG. 2 illustrates how a magnetic field gradient produced in the direction of the Z-axis by magnetic field gradient coils in a coil unit as shown in FIG. 1 is adversely affected by an eddy current induced in a magnetic resonance imaging apparatus as shown in FIG. 1. When a voltage $E_{GC}$ having a waveform as shown in FIG. 2(a) is applied to the magnetic field gradient coils, and a current $I_{GC}$ having a waveform as shown in FIG. 2(b) flows through the magnetic field gradient coils, a magnetic field gradient $H_{GC}$ having a strength as shown in FIG. 2(c) is produced by the magnetic field gradient coils. However, as described already, an eddy current magnetic field He is produced as shown in FIG. 2(d) by the eddy current induced in the heat reflecting cylindrical members 5 and 6, when the current $I_{GC}$ shown in FIG. 2(b) flows through the magnetic field gradient coils. Since this eddy current magnetic field He acts to restrict magnetic field gradient $H_{GC}$ as shown in FIG. 2(c), the resultant effective magnetic field gradient $H_{ef}$ will be as shown in FIG. 2(e). In FIG. 2, the horizontal axis represents time.

Figure 3:
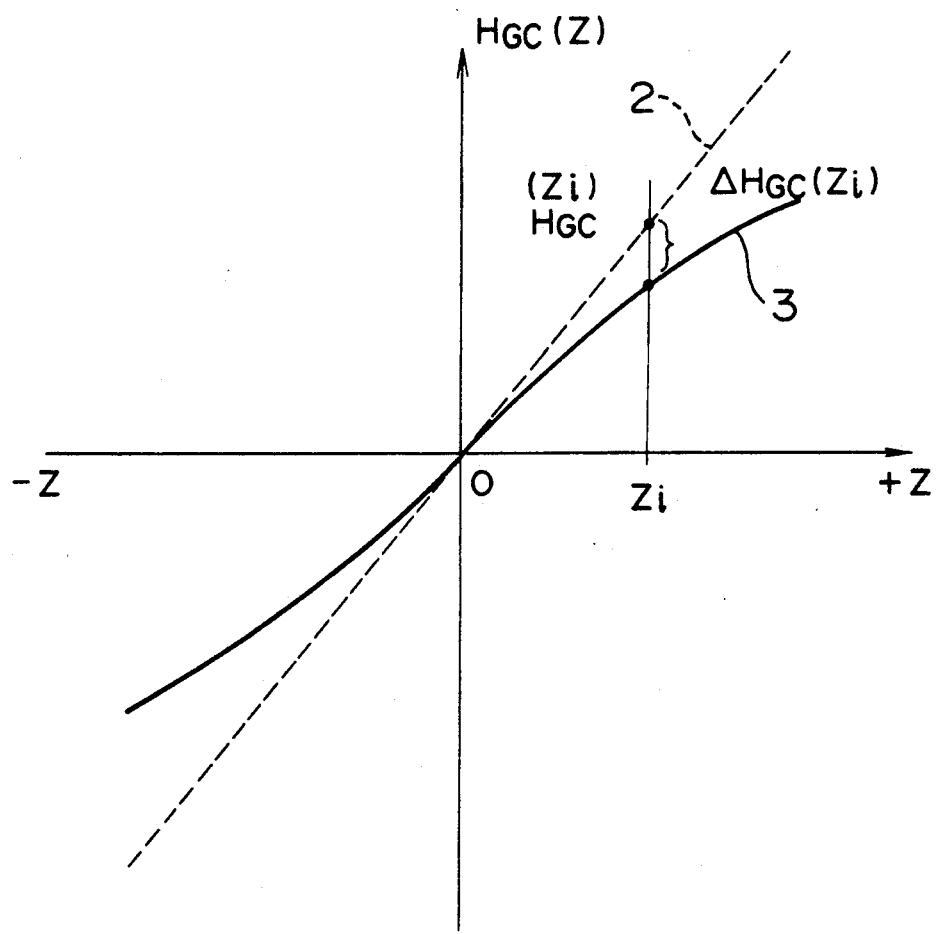
FIG. 3 is a graph illustrating how the linearity of the magnetic field gradient in the direction of the Z-axis is degraded under influence of the eddy current.

FIG. 3 illustrates how the linearity of the magnetic field gradient in the direction of the Z-axis is degraded under influence of such an eddy current. In FIG. 3, the horizontal axis represents the direction of the Z-axis, and the axis central position of the sensor probe 15 is taken as the origin O, while the vertical axis represents the strength of the magnetic field gradient $H_{GC}(Z)$ in the direction of the Z-axis. Although the strength of the magnetic field gradient $H_{GC}(Z)$ is to be ideally given by a linear function as shown by a straight line 2 in FIG. 3, it is actually given by a curve 3 when it is influenced by the eddy current. Thus, when the value of $H_{GC}(Z)$ on the ideal straight line 2 is $H_{GC}(Zi)$ at a position Zi on the Z-axis, and the difference between the ideal value $H_{GC}(Zi)$ and the actual value on the curve 3 is expressed as $\Delta H_{GC}(Zi)$, the linearity of the magnetic field gradient $H_{GC}(Z)$ is given by $\Delta H_{GC}(Zi)/2H_{GC}(Zi)$. Generally, the linearity is degraded more when the influence of the eddy current becomes greater.

As discussed above, the prior art magnetic field gradient coil systems are defective in that the strength of the effective magnetic field gradient $H_{ef}$ is lowered, and the linearity of the magnetic field gradient is degraded under influence of the eddy current. Such a problem is satisfactorily solved in the embodiment of the present invention as described hereinafter.

Figure 4:
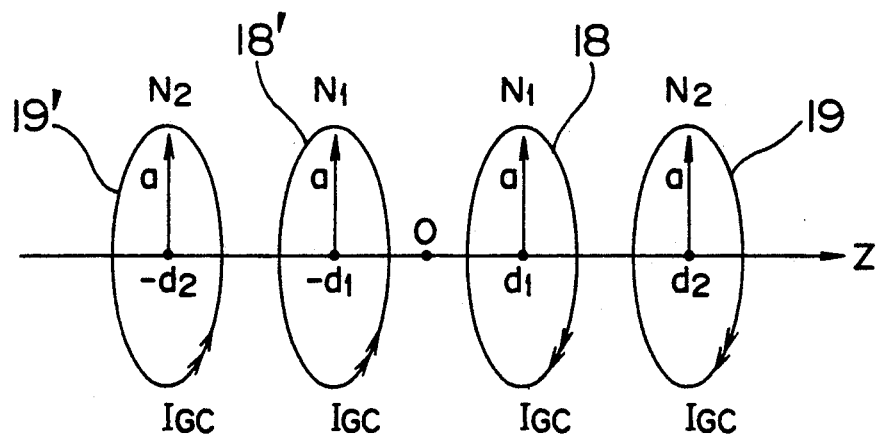
FIG. 4 shows the arrangement of the Z-axis magnetic field gradient coils in the coil unit shown in FIG. 1.

FIG. 4 shows the arrangement of Z-axis magnetic field gradient coils included in the magnetic field gradient coil unit 4, shown in FIG. 1. for producing the magnetic field gradient in the direction of the Z-axis. Referring to FIG. 4, one pair of first coils 18, 18' and one pair of second coils 19, 19' are disposed in a relation symmetrical with respect to the XY plane passing the origin O, respectively. Double arrows in FIG. 4 indicate the directions of current flowing through these coils. More precisely, the direction of current flow in the first and second coils 18 and 19 disposed on one side of the origin O is the same, while the direction of current flow in the first and second coils 18' and 19' disposed on the other side of the origin O is opposite to the direction of current flow in the first and second coils 18 and 19.

Figure 5:
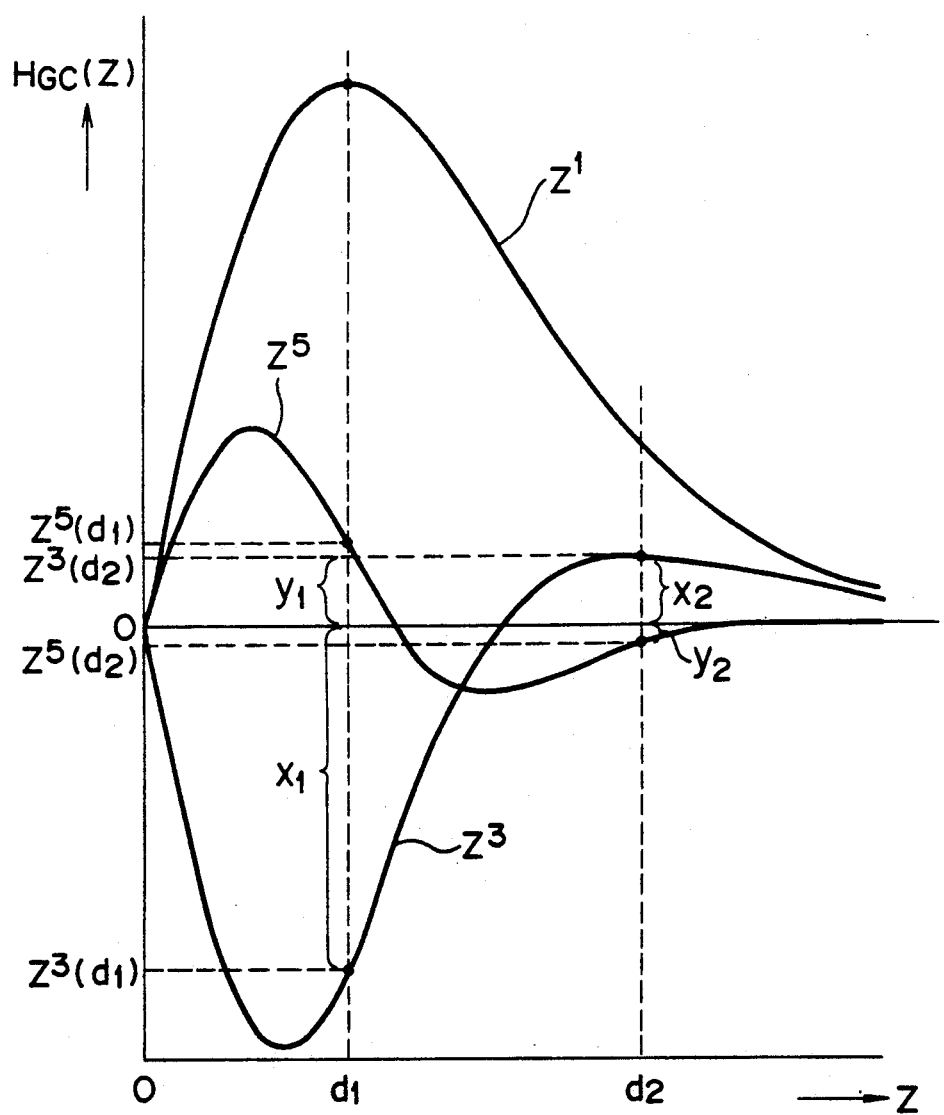
FIG. 5 is a graph showing the relation between the position of one of the magnetic field gradient coil pairs and the strength of the Z-axis magnetic field components of first, third and fifth orders at a selected point on the Z-axis when the position of the magnetic field gradient coil pair is shifted in the direction of the Z-axis.

FIG. 5 is a graph showing the relation between the position of one of the magnetic field gradient coil pairs disposed symmetrically with respect to the origin O and the strength (an absolute value) of the Z-axis magnetic field components of first, third and fifth orders at a selected point on the Z-axis, when the coil position expressed by the distance from the origin O is shifted under the condition in which the energizing current is supplied to the coil pair. Characteristic curves on the side of the minus Z-axis are point symmetry of those shown in FIG. 5. However, those characteristic curves are not shown in FIG. 5 for the sake of avoiding confusion. These characteristic curves hold for each of the first and second coil pairs.

As the ratio between the mean radius b of the heat reflecting cylindrical member 5 and the radius a of the first coils 18, 18' and second coils 19, 19' approaches $b/a = 1$, that is, as the heat reflecting cylindrical member 5 is located nearer to the first and second coils, the strength of the magnetic field component of first order in the direction of the Z-axis decreases, while the strength of the magnetic field components of third and fifth orders adversely affecting the linearity of the magnetic field gradient in the direction of the Z-axis shows a relative increase. This is because the Z-axis gradient of the magnetic field produced by the first and second coils is affected by an eddy current induced in the heat reflecting cylindrical member 5 by the pulse current supplied to the first and second coils.

In the embodiment of the magnetic field gradient coil system according to the present invention, the position corresponding to one end of the sensor probe 15 on the Z-axis is selected as the selected position described above when the origin O is set at the center of the MR imaging object 16 in the direction of the Z-axis, that is, at the center of the axial length of the sensor probe 15 in the direction of the Z-axis, and each of the coils of the first coil pair is disposed at such a position which is distant from the origin O by a distance $d_1$ and where the value of the magnetic field component of first order in the direction of the Z-axis becomes maximum at the selected position as shown in FIG. 5.

Each of the coils of the second coil pair is disposed at a position distant from the origin O by a distance $d_2$. This position is such that, when the ampere-turn of the second coils is suitably selected, and the first coil pair is disposed at the distance $d_1$ from the origin O, the Z-axis magnetic field components of third and fifth orders provided by the first coil pair at the selected position can be cancelled by the Z-axis magnetic field components of third and fifth orders provided by the second coil pair. More precisely, the relation between the second coil pair disposed at the distance $d_2$ from the origin O and the first coil pair disposed at the distance $d_1$ from the origin O is such that, at the selected position, the polarity of the Z-axis magnetic field components of third and fifth orders provided by the second coil pair is opposite to the polarity of the Z-axis magnetic field components of third and fifth orders provided by the first coil pair, and the ratio between the absolute values of the former Z-axis magnetic field components of third and fifth orders is selected to be equal to that of the latter. That is, the distances $d_1$ and $d_2$ are so selected as to satisfy the following relation:

$$|Z^3(d_1)/Z^5(d_1)| = |Z^3(d_2)/Z^5(d_2)|$$

Further, the ratio between the ampere-turn of the second coil pair and that of the first coil pair is selected to be equal to the reciprocal of the ratio between the Z-axis magnetic field component of third order provided by the first coil pair at the selected position and that provided by the second coil pair at the selected position, or that relating to the fifth order. The above relations can be summarized as follows:

$$|Z^3(d_1)/Z^5(d_1)| = |Z^3(d_2)/Z^5(d_2)| \qquad \ldots (1)$$

$$|Z^3(d_2)/Z^3(d_1)| = |Z^5(d_2)/Z^5(d_1)| = I_1N_1/I_2N_2 \qquad \ldots (2)$$

It is apparent that the values of the data shown in FIG. 5, hence, the relative disposed positions of the first and second coil pairs will differ depending on the value of the ratio $b/a$. However, the equations (1) and (2) remain unchanged.

Therefore, the Z-axis magnetic field component of the first order becomes maximum and the degradation of the linearity of the magnetic field gradient can be eliminated, because the Z-axis magnetic field components of third and fifth orders are substantially cancelled by those provided by the second coil pair, respectively.

When now it is supposed that $I_1 = I_2$ in the equation (2), the rightmost member of the equation (2) is expressed as $N_1/N_2$. This means that, by merely determining the ratio between the number of turns of the first coils and that of the second coils so as to satisfy the equation (2), the Z-axis magnetic field components of third and fifth orders provided by the first coil pair can be substantially cancelled by those provided by the second coil pair respectively.

According to the prior art coil systems described already, the first and second coils are disposed at such relative positions where the values of the Z-axis magnetic field components of fifth order are substantially equal to zero. Therefore, it is apparent that the values of the Z-axis magnetic field components of first order are inevitably decreased, and the Z-axis magnetic field components of third order too cannot be cancelled.

The practically usable value of the ratio $b/a$ lies generally within the range of $1.1 \leq b/a \leq 1.5$. When the value of the ratio $b/a$ is smaller than 1.1, it is difficult to interpose the magnetic field corrector 14 between the magnetic field gradient coil unit 4 and the heat reflecting cylindrical member 5. On the other hand, when the value of the ratio $b/a$ is larger than 1.5, the ratio $b/a$ having such a value is outside of the substantial limits provided for the purpose of reducing the size of the superconducting magnet. Thus, the value of the Z-axis magnetic field component of first order provided by the first coil pair becomes maximum or is very close to the maximum, while the Z-axis magnetic field components of third and fifth orders provided by the first coil pair can be substantially cancelled by those provided by the second coil pair respectively, when the value of the ratio $b/a$ is selected to satisfy the relation $1.1 \leq b/a \leq 1.5$, and the values of the distances $d_1$ and $d_2$ in mm are selected to satisfy the following relations:

$$64\left(\frac{b}{a} - 1.1\right) + 0.4a \leqq |d_1| \leqq 44\left(\frac{b}{a} - 1.1\right) + \frac{a}{2} \quad (3)$$

$$0.876a < |d_2| < 1.16a \quad (4)$$

Each of the first and second coils is shown by a single line in FIG. 4. Actually, however, their sectional shape is circular or rectangular and has a finite area. Therefore, each of the distances $d_1$ and $d_2$ should naturally be considered as that between the origin O and the center of the section of the corresponding coil. Also, the radius a should be considered as the distance between the center and the periphery of the section of the coil.

The number of turns of the second coil is larger than that of the second coil, and a stacked coil arrangement is commonly employed for the second coil. Thus, the radius a of the second coil is actually larger than the radius a of the first coil. However, in a magnetic field gradient coil system commonly employed in a magnetic resonance imaging apparatus, the value of the ratio (the radius of the second coil—the radius of the first coil)/(the radius of the first coil) is so small that it is almost negligible. Therefore, it can be considered that the radius of the first coil $\approx$ the radius of the second coil = a.

We claim:

1. A magnetic field gradient coil system for use in a magnetic resonance imaging apparatus for forming a magnetic field gradient in a direction of a Z-axis of an X, Y, Z orthogonal coordinate system having its origin at a selected fixed position of the imaging apparatus, comprising:

one pair of first coils and one pair of second coils having their centers on the Z-axis and having the same radius, the coils of each coil pair being disposed symmetrically with respect to an XY plane including said origin, the coils of said second coil pair being located more distant from said origin than the coils of said first coil pair, the coils of said first and second coil pairs disposed on one side of said origin being supplied with current flowing in the same direction, while the coils disposed on the other side of said origin being supplied with current flowing in a direction opposite to the direction of current flow in said coils disposed on said one side of said origin;

each of the coils of said first coil pair being disposed at such a position where the value of the Z-axis magnetic field component of first order at a selected position on the Z-axis becomes substantially maximum when the current is supplied to said first coil pair to provide a predetermined ampere-turn; and each of the coils of said second coil pair being disposed at such a position where the Z-axis magnetic field components of third and fifth orders provided by said second coil pair at said selected position have values which can substantially cancel the Z-axis magnetic field components of third and fifth orders provided by said first coil pair at said selected position when the current is supplied to said second coil pair to provide an ampere-turn having a selected ratio between it and the ampere-turn provided by the current supplied to said first coil pair.

2. A magnetic field gradient coil system for use in a magnetic resonance imaging apparatus for forming a magnetic field gradient in a direction of a Z-axis of an X, Y, Z orthogonal coordinate system having its origin at a selected fixed position in the system, comprising:

one pair of first coils and one pair of second coils having their centers on the Z-axis and having the same radius, the coils of each coil pair being disposed symmetrically with respect to an XY plane including said origin, the coils of said second coil pair being located more distant from said origin than the coils of said first coil pair, the coils of said first and second coil pairs disposed on one side of said origin being supplied with current flowing in the same direction, while the coils disposed on the other side of said origin being supplied with current flowing in a direction opposite to the direction of current flow in said coils disposed on said one side of said origin;

each of the coils of said first coil pair being disposed at such a position where the value of the Z-axis magnetic field component of first order at a selected position on the Z-axis becomes substantially maximum when the current is supplied to said first coil pair to provide a predetermined ampere-turn;

each of the coils of said second coil pair being disposed at such a position where the polarity, at said selected position, of the Z-axis magnetic field components of third and fifth orders provided by said second coil pair is opposite to the polarity, at said selected position, of the Z-axis magnetic field components of third and fifth orders provided by said first coil pair respectively, and the ratio between the absolute values of said magnetic field components of third and fifth orders provided by said first coil pair is equal to the ratio between the absolute values of said magnetic field components of third and fifth orders provided by said second coil pair; and the ratio between the ampere-turn of said first coil pair and the ampere-turn of said second coil pair being selected to be equal to the reciprocal of the ratio between the absolute value of said magnetic field component of third order provided by said first coil pair and the absolute value of said magnetic field component of third order provided by said second coil pair.

3. A magnetic field gradient coil system according to claim 2, wherein the ratio between the number of turns of the coils of said first coil pair and the number of turns of the coils of said second coil pair is selected to be equal to the reciprocal of the ratio between the absolute value of said magnetic field component of third order provided by said first coil pair and the absolute value of said magnetic field component of third order provided by said second coil pair at said selected position, and the current supplied to said first coil pair is selected to be equal to the current supplied to said second coil pair.

4. A magnetic field gradient coil system according to claim 2, wherein the ratio between the current supplied to said first coil pair and the current supplied to said second coil pair is selected to be equal to the reciprocal of the ratio between the absolute value of said magnetic field component of third order provided by said first coil pair and the absolute value of said magnetic field component of third order provided by said second coil pair at said selected position, and the number of turns of each coil of said first coil pair is equal to the number of turns of each coil of said second coil pair.

5. A magnetic field gradient coil system for use in a magnetic resonance imaging apparatus for forming a magnetic field gradient in a direction of a Z-axis of an X, Y, Z orthogonal coordinate system having its origin at a selected fixed position in the imaging apparatus, said magnetic resonance imaging apparatus including a cylindrical electrical conductive member whose central axis coincides with the Z-axis, which has a mean radius b and which is formed with an internal space extending through its central part in the direction of the Z-axis for receiving said magnetic field gradient coil system in said internal space, said magnetic field gradient coil system comprising:

one pair of first coils and one pair of second coils having their centers on the Z-axis and having the same radius a, the coils of each coil pair being disposed symmetrically with respect to an XY plane including said origin, the coils of said first coil pair being disposed at a distance $d_1$ from said origin, while the coils of said second coil pair being disposed at a distance $d_2$ from said origin, said second coil pair being located more distant from said origin than said first coil pair, the coils of said first and second coil pairs disposed on one side of said origin being supplied with current flowing in the same direction, while the coils disposed on the other side of said origin being supplied with current flowing in a direction opposite to the direction of current flow in said coils disposed on said one side of said origin, and said radii a, b and said distances $d_1$, $d_2$ being selected to satisfy the following relations:

$$1.1 \leq \frac{b}{a} \leq 1.5$$

$$64\left(\frac{b}{a} - 1.1\right) + 0.4a \leq |d_1| \leq 44\left(\frac{b}{a} - 1.1\right) + \frac{a}{2}$$

$$0.876a < |d_2| < 1.16a.$$

* * * * *